(12) United States Patent
Gummin

(10) Patent No.: US 6,597,573 B2
(45) Date of Patent: Jul. 22, 2003

(54) VACUUM FEEDTHROUGH HEATPIPE ASSEMBLY

(76) Inventor: Mark A. Gummin, 1731 St. Andrews Ct., St. Helena, CA (US) 94574

( * ) Notice: Subject to any disclaimer, the term of this patent is extended or adjusted under 35 U.S.C. 154(b) by 0 days.

(21) Appl. No.: 10/067,590

(22) Filed: Feb. 4, 2002

(65) Prior Publication Data

US 2002/0105784 A1 Aug. 8, 2002

Related U.S. Application Data

(60) Provisional application No. 60/266,256, filed on Feb. 5, 2001.

(51) Int. Cl.[7] .................................................. H05K 7/20
(52) U.S. Cl. ................. 361/700; 62/259.2; 165/104.33; 257/715
(58) Field of Search ......................... 62/3.2, 3.3, 3.7, 62/259.2; 165/80.3, 80.4, 185, 104.33; 257/714, 715, 930; 174/15.2; 361/699, 700, 704, 705, 717–719

(56) References Cited

U.S. PATENT DOCUMENTS

| | | | |
|---|---|---|---|
| 3,678,889 A | * | 7/1972 | Murakami et al. .......... 118/720 |
| 4,199,953 A | * | 4/1980 | Richter, Jr. et al. ............ 62/3.2 |
| 4,474,170 A | * | 10/1984 | McConnell et al. ........ 126/636 |
| 5,781,409 A | * | 7/1998 | Mecredy, III ............... 361/687 |
| 6,175,493 B1 | * | 1/2001 | Gold .......................... 361/687 |

OTHER PUBLICATIONS

Pgpub US 2002/105784 A1 Aug. 8, 2002.*

Pgpub US 2001/0040022 A1, (Jan. 4, 2000 effective date).*

* cited by examiner

Primary Examiner—Gerald Tolin
(74) Attorney, Agent, or Firm—Howard Cohen

(57) ABSTRACT

A vacuum feedthrough heatpipe assembly includes a heatpipe having an inner end coupled to a heat generating device within a vacuum chamber, and an outer end disposed externally of the vacuum chamber. A vacuum flange seals the heatpipe to an opening in the chamber wall. The invention also includes an articulated arm assembly, each arm being a sealed heat pipe, the arms joined by angularly adjustable elbow joints. The heatpipe may comprise an electrically insulating construction formed of quartz or ceramic tube.

9 Claims, 3 Drawing Sheets

VACUUM FEEDTHROUGH HEATPIPE ASSEMBLY

REFERENCE TO RELATED APPLICATION

This application is related to Provisional Application No. 60/266,256, filed Feb. 5, 2001, for which priority is claimed.

BACKGROUND OF THE INVENTION

A heat pipe is a closed-loop, cooling device wherein heat is transferred from the 'evaporator'-end to the 'condenser'-end of a sealed tube using the latent heat of vaporization as the principal means of energy transfer. A heat-pipe consists of three principal elements: 1) a sealed tube (typically copper), 2) a heat-transfer medium (such as water, ammonia, or methanol) enclosed under partial vacuum (or pressurized in some cases) within the tube, and 3) an internal 'wick' structure. The addition of heat to the evaporator end of the tube vaporizes the liquid heat-transfer medium, which is transported by vapor pressure to the condenser end. Upon collision with the cooler surfaces of the condenser, the vapor condenses, and is transferred by capillary action through the wick to the evaporator end, thus closing the loop.

Heat-pipes have been used commercially for decades as a means of 'passively' removing excess heat from critical, confined areas and transporting it to a remote condenser (or radiator). Heat pipes are used in spacecraft, for instance, to remove power from internal electronic components, and transport that power to radiators on the outside of the spacecraft. They have also been applied to the consumer electronics (computer) industry to remove the heat generated by high-powered processors. Heat pipes have recently become very affordable, due to major advances in automated manufacturing techniques, and are available in a variety of shapes and dimensions, wick-types, and cooling fluids. The same technology has also been applied to 'plates,' whereby heatpipes are embedded in thin pads, with a single condenser attachment point.

Due to the enormous latent heat of vaporization of some fluids, the heat-removing capacity of heat pipes is enormous; easily 10,000 times that of solid copper rods of equal dimensions. In addition, the $\Delta T$ ('delta-T') or temperature difference between a power source and the condenser can be as low as a few degrees while for a similarly dimensioned copper rod the $\Delta T$ would be much higher. This condition is especially true when heat exchange is limited primarily to conduction, as it is when the power source is being operated in ultra high vacuum environments. (Radiation and convection are the other means of thermodynamic exchange, and only radiation and conduction play a part in vacuum thermal exchange.)

SUMMARY OF THE INVENTION

The application of proven heatpipe technology to terrestrial vacuum environments is the focus of this invention. The present invention describes a passive means of removing large amounts of power (hundreds of Watts), inexpensively, simply, and effectively, without compromising the cleanliness of the vacuum chamber. The important aspects of the invention are:

I. A heatpipe that extends from within the walls of a vacuum vessel, wherein a heat generating source is located, to the outside of the vacuum vessel, wherein a cooling means is available. This heatpipe is therefore referred to as a 'vacuum feedthrough heatpipe.'

II. A means of attaching the heat generating source to the heat pipe with contacts of high thermal-conductivity (pieces that clamp onto the heat-pipe, or that are bonded, soldered, brazed, or otherwise attached with high thermal-conductivity means);

III. A choice of materials and coatings that permit optimal operation within the UHV environment (such as nickel plating on the copper heat pipe, and highly polished aluminum clamp pieces. Such low-absorptivity finishes are necessary in order to minimize radiative coupling to the environment);

IV. A means of joining the heatpipe to a suitable vacuum feed-through, utilizing brazed, welded, soldered, or bonded vacuum seals; and, V. Cooling the condenser-end of the heat-pipe (outside of vacuum) using either convection (forced or natural), or conduction (such as a coil of water or other heat-transfer medium, or a thermo-electric cooler unit). The temperature of the condenser can thusly be accurately controlled in order to provide a range of operating temperatures of the evaporator (the $\Delta T$ remains constant for a given source-power).

VI. An articulated assembly formed of a plurality of arms joined by adjustable elbow assemblies, wherein each arm comprises a heatpipe, and the condenser end of one heatpipe is joined to the evaporator end of the next heatpipe.

This device could be used anywhere it is necessary to remove 'waste' heat from within a vacuum vessel or chamber. Without special means of removing heat from vacuum chambers, heat-producing processes will become very hot during operation. Use of this device will be very advantageous when contamination control of the vacuum vessel is critical, or when conventional cooling means do not have sufficient capacity to cool the heat-source.

The conventional means of removing heat from within vacuum chambers (wafer fabrication chambers, deposition chambers, or powered instruments, for example) are:

a) Solid copper rods for which there is generally a large and uncontrollable temperature difference, $\Delta T$. The large thermal mass of copper also requires a long time to equilibrate.

b) Liquid or gaseous cooling coils for which plumbing and fittings inside the vacuum vessel are typically required. These are often undesirable, in that the cooling fluid may escape into the vacuum chamber in time, due to thermal or mechanical cycling of the plumbing fixtures and connections. Also, water is typically poured wastefully down the drain to avoid the high cost of recycling heat exchangers.

The vacuum feed-through heat-pipe assembly has no moving parts within the vacuum chamber, and therefore has extremely long life. It is a completely sealed unit, fabricated of ultra-high vacuum-compatible materials, thereby providing a long lifetime of extremely clean operation. The thermal mass of the system is very low, allowing for rapid response to power changes. Finally, temperature control of the condenser end allows for accurate control of the source temperature, since the temperature drop across the heatpipe is constant for a given source power.

BRIEF DESCRIPTION OF THE DRAWING

FIG. 4 is a plan view of an articulated arm heatpipe assembly for use in a vacuum feedthrough mounting and the like.

DETAILED DESCRIPTION OF THE INVENTION

Figure 1:
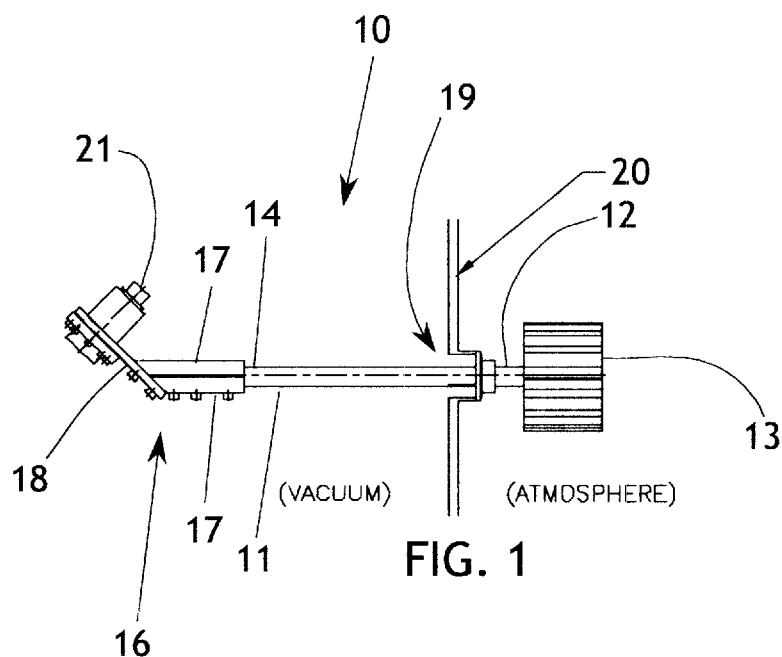
FIG. 1 is a plan view of a heatpipe extending through a feedthrough of a vacuum chamber.
Figure 2:
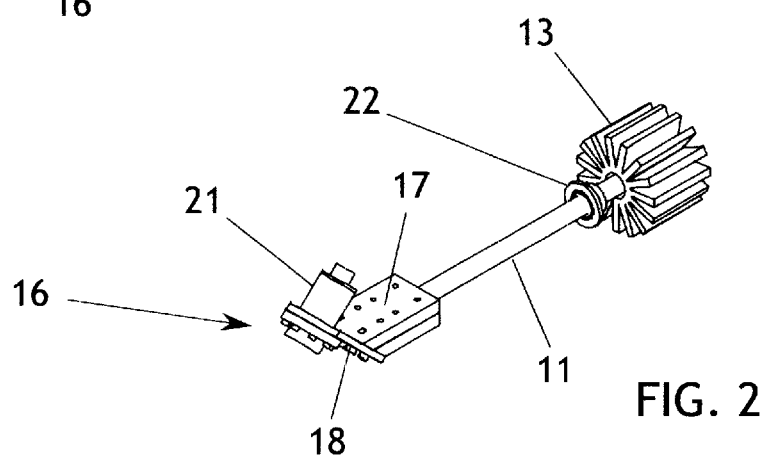
FIG. 2 is a perspective view of one embodiment of a heatpipe used in the present invention.
Figure 3:
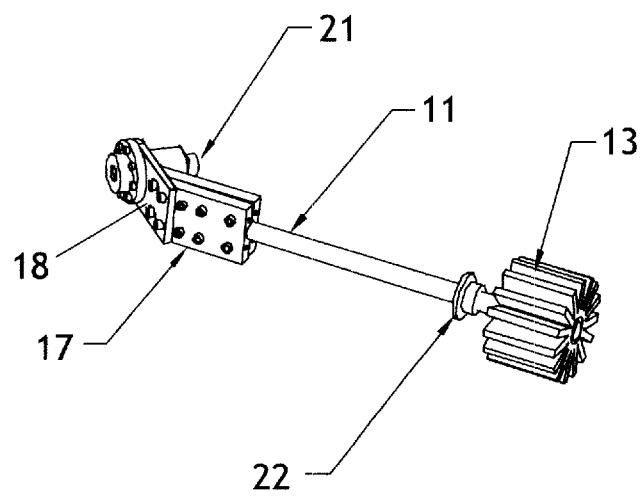
FIG. 3 is a further perspective view of the heatpipe embodiment shown in FIG. 2.

The present invention generally comprises a heat pipe assembly 10 that is designed for use in a vacuum environment, particularly a terrestrial vacuum environment such as a vacuum chamber that houses heat-generating devices. With regard to FIGS. 1–3, one embodiment of the invention includes a heatpipe 11 having an outer end 12 which is secured to a cooling device 13, such as a convection or conduction cooling device known in the prior art. The inner end 14 of the heat pipe is joined to an adapter assembly 16, which is comprised of a pair of clamp plates 17 formed to sandwich the end 14 of the heat pipe. A soft interface material, such as 0.005" thick copper sheet, is interposed between the clamp surfaces and the end portion 14 of the heatpipe. An adapter plate 18 extends from the clamp plates 17, and is joined to a heat generating device 21, such as an electronic heat source. Alternatively, the inner end 14 of the heatpipe and adapter plate 18 may be co-formed by welding or otherwise attaching the adapter plate directly to the heatpipe prior to nickel-plating or other coating process.

The heat pipe may be formed of copper tube, and the components of the adapter assembly 16 are preferably fabricated of aluminum, which has high thermal conductivity and relatively low density (and thus low thermal mass). The aluminum pieces are very highly polished, providing a surface finish that has very low infrared absorptivity and emissivity. Also, since the aluminum is heated during polishing, the surface is passivated by a thick $Al_2O_3$ layer, which (being sapphire) also provides a very high thermal conductivity.

The heatpipe 11 is secured to the vacuum feed-through 19 at a medial portion thereof. The vacuum feed-through may consist of a flange 22 that is brazed or otherwise connected to the heatpipe 11, and provides a good vacuum seal. Any one of numerous vacuum flanges known in the prior art may be used (Conflat, NW, ASA, and the like). The vacuum feed-through is adapted to be secured at an opening in the wall 20 of a vacuum vessel.

In one specific embodiment, the heat pipe assembly 10 is designed specifically to maintain the heat-sink temperature of a Temperature-controlled Quartz-Crystal Microbalance (TQCM) 21 at roughly room temperature (21° C.), while the TQCM is operating within the vacuum vessel at ultra high vacuum and under nominal 6.5 Watt load. The TQCM crystal is cooled by a thermoelectric cooler, and is typically held at −20° C. The heat sink of the thermoelectric cooler must stay at or near room-temperature or cooler in order to allow the cold side to reach low temperatures. The vacuum chamber walls (or shroud) are typically held at an elevated temperature of 100° C., and so all materials used in the heatpipe assembly must be constructed of materials of low thermal absorptivity in order to minimize heat-loading from the environment. The heat pipe is approximately ⅝" diameter, 18" long, with 11" of the assembly inside the vacuum vessel. The TQCM is bolted to the adapter plate 18, which is then joined to the clamp plates 17 that attach to the heat pipe.

Figure 4:
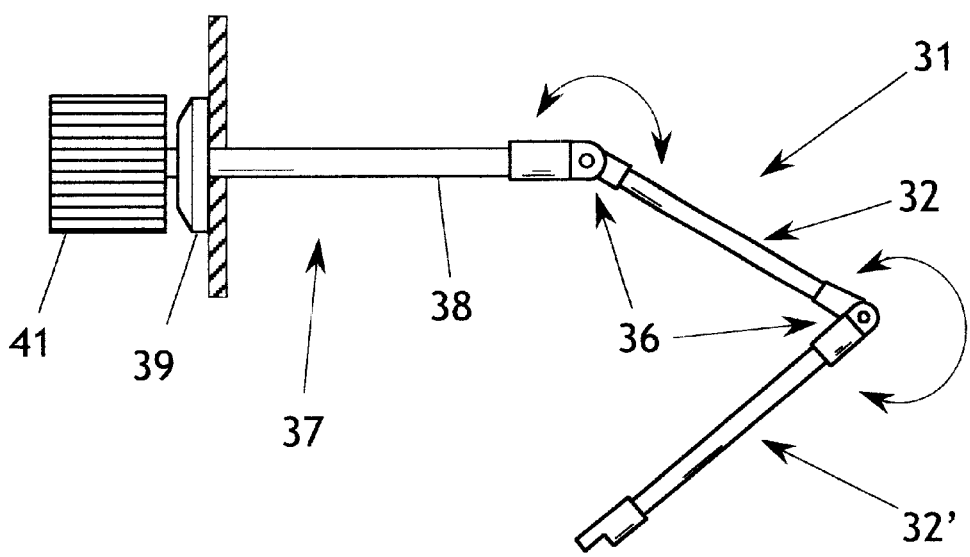
Figure 5:
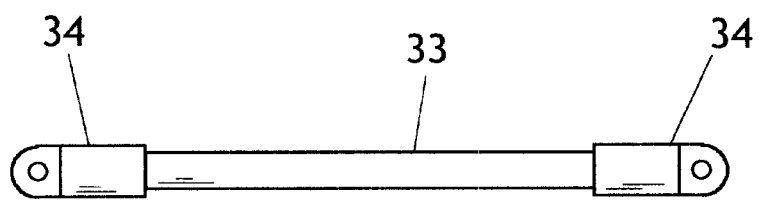
FIG. 5 is a plan view of one embodiment of an arm of the articulated arm assembly of FIG. 4.
Figure 6:
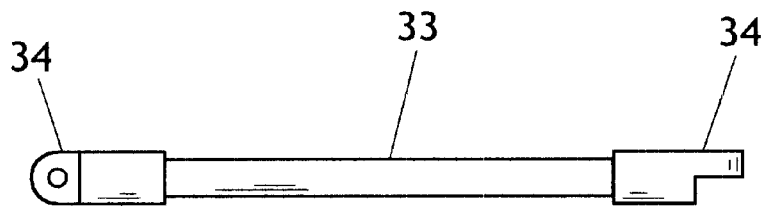
FIG. 6 is a plan view of another embodiment of an arm of the articulated arm assembly of FIG. 4.

A further aspect of the invention is the provision of an articulated arm assembly 31, as shown in FIG. 4, for the removal of heat from an enclosure such as a vacuum chamber. The assembly includes at least one arm assembly 32, which comprises a heatpipe having an evaporator end and a condenser end. As shown in FIGS. 5 and 6, each arm assembly 32 includes a sealed heatpipe 33 having a pair of elbow brackets 34 secured to opposed ends thereof. The elbow brackets are formed in conventional fashion for complementary engagement to comprise an elbow joint 36 that may be disposed at any desired angle within a broad range, whereby the articulated assembly may be disposed in a wide range of configurations. The elbow brackets 34 may be oriented to have parallel pivot axes, as in FIG. 5, or to have orthogonal pivot axes, as in FIG. 6 (any other angular orientation is also possible) to permit articulation in three dimensions.

Figure 7:
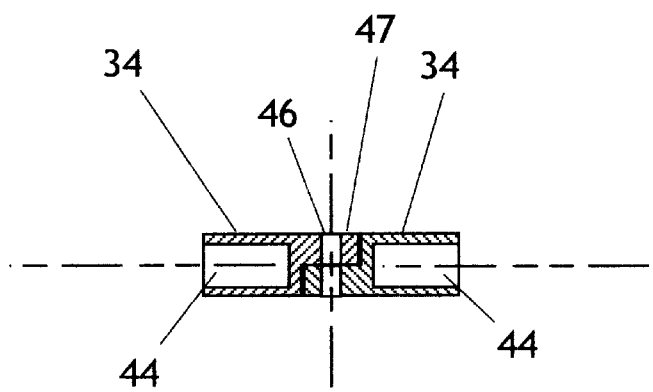
FIG. 7 is an enlarged cross-sectional view of an elbow joint of the articulated arm assembly of FIG. 4.
Figure 8:
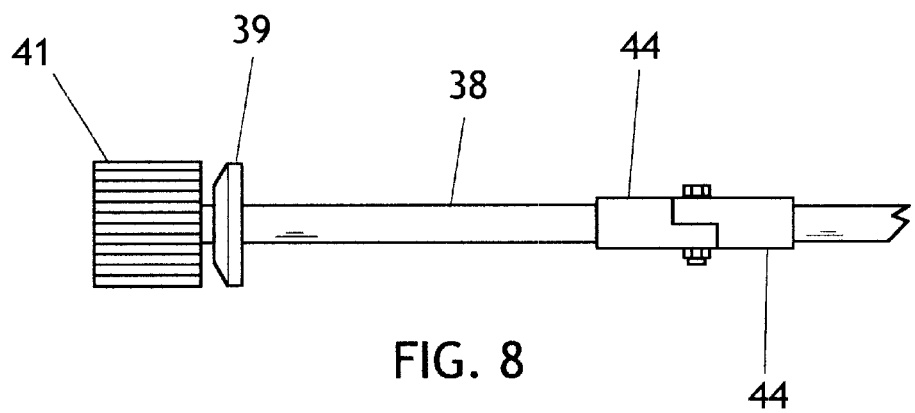
FIG. 8 is a partial top view of the articulated arm assembly of FIG. 4.

As shown in FIG. 7, each elbow bracket 34 includes a socket 44 to receive one end of a heat pipe 33 in intimate contact with a large surface area, whereby heat transfer is maximized. Likewise, each bracket 34 includes a tab end 47 having a large flat surface to engage a mating tab end of another bracket, also to maximize heat transfer. The aligned holes 46 receive a bolt and nut assembly, as shown in FIG. 8, to join the brackets and permit adjustment of the angular relationship therebetween.

The assembly 31 also includes one heat pipe assembly 37 (FIG. 8) comprised of a heat pipe 38 having an elbow bracket 34 at one end and a vacuum flange 39 and cooling device 41 secured to the other end. The arms assemblies 32 are connected so that the proximal arm 32' has a proximal evaporator end connected to a heat source within an enclosure, and the condenser end is connected to the evaporator end of the serially adjacent heatpipe of the articulate arm assembly 31. Thus heat is transferred by the superior fluid thermodynamics of each heatpipe to the next, and ultimately to the cooling device 41 at the exterior of the enclosure.

With the building blocks of the articulated assembly described above, an entire product-line of heat-pipe assemblies can be developed. Within the vacuum chamber, the use of flexible, rotating, or sliding attachments of the 'condenser'-end of one pipe to the 'evaporator'-end of another pipe permits series operation of the heat-pipe assemblies. Each elbow joint interface will result in a small temperature drop, and so must be designed for a given maximum power load and allowable temperature drop. Multiple segments can be arranged, end-to-end, to create complex, movable connections to components within the vacuum chamber. The recommended angular orientation of each segment is either near horizontal, or with the evaporator end below the condenser end. However, the wick provided in typical heatpipe construction permits operation at virtually any angle, as long as the power level is low, and the 'head' is not too high. This arrangement works well for thin tubes and only about 4" of head.

Heat-pipe assemblies can also be arranged in parallel to increase the heat-removing capacity or to provide structural rigidity or other desirable action. Using the 'plate' technology as well, large components can be connected to the feed-through assembly, allowing complex structures to be connected serially and in parallel to provide complete thermal management solutions to vacuum heat-removal problems.

Figure 9:
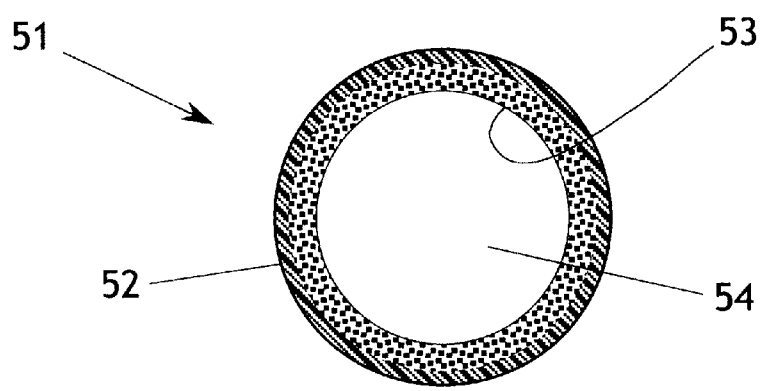
FIG. 9 is a cross-sectional view of a heat pipe construction made in accordance with the present invention.

Another aspect of the invention is the provision of a heat-pipe that produce very high thermal conductivity combined with electrical insulating properties. With regard to FIG. 9, a heatpipe 51 is comprised of an impervious, electrically non-conductive outer layer 52 formed of a material such as quartz or ceramic compound or equivalent vitreous material. The wick structure of the heatpipe is comprised of a porous annular layer 53, which may be integrally formed with the outer layer and comprised of porous ceramic material, sintered metal or ceramic, or the like. The inner lumen 54 of the heatpipe 51 is open to permit the free transport of vapor from the evaporation end to the condenser end of the heatpipe. A vacuum feedthrough (referred to as 'a vacuum/electrical break') may be manufactured from an electrically insulating material such as quartz or ceramics. The feedthrough may be a glass-to-metal seal, which is well-known in the prior art, to provide an electrically insulated, vacuum-sealed mounting The quartz or ceramic heatpipe may be as small as a pillbox, or similar in size to the previous feedthrough embodiment (⅝' diameter by 18' long). Both the evaporator and condenser ends must be constructed with a heat conducting metal (such as copper) end-cap with dimensions large enough and/or long enough to provide sufficient thermal conduction capacity (clamping means, or other) to the heat source.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. An apparatus for removing heat from a sealed vacuum enclosure, including:
    an articulated arm assembly having an inner end disposed within said vacuum enclosure and an outer end disposed externally of said vacuum enclosure;
    said articulated arm assembly includes a plurality of arms, each arm including a sealed heatpipe assembly;
    a plurality of elbow joint means, each secured to a pair of said sealed heatpipe assemblies in end adjacent fashion, whereby said plurality of arm assemblies are joined together end to end and are angularly adjustable;
    means for coupling said inner end to a heat generating device within said vacuum enclosure;
    means for coupling said outer end to a cooling device external to said vacuum enclosure.

2. The apparatus for removing heat from a vacuum enclosure of claim 1, further including vacuum feedthrough means for extending one of said arm assemblies in sealed fashion through an opening in said vacuum enclosure.

3. The apparatus for removing heat from a vacuum enclosure of claim 2, wherein said vacuum feedthrough means includes vacuum flange means joined to said one arm assembly and secured to said opening in sealed fashion.

4. The apparatus for removing heat from a vacuum enclosure of claim 1, wherein said means for coupling said inner end to a heat generating device include an adapter assembly having one portion joined to said inner end and another portion coupled to said heat generating device.

5. The apparatus for removing heat from a vacuum enclosure of claim 1, wherein each of said plurality of elbow joint means includes a pair of elbow brackets, each elbow bracket secured to a one end of a respective arm assembly.

6. The apparatus for removing heat from a vacuum enclosure of claim 5, wherein said elbow brackets are oriented to permit angular adjustment of said articulated arm assembly in three dimensions.

7. The apparatus for removing heat from a vacuum enclosure of claim 5, wherein each elbow bracket includes a tab portion adapted for complementary engagement with another tab portion of another elbow bracket, said tab portions having substantial surface contact area to maximize heat transfer through said elbow joint means.

8. An apparatus for removing heat from a sealed vacuum enclosure, including:
    a sealed heatpipe assembly having a proximal, evaporator end and a distal, condenser end;
    vacuum feedthrough means for extending said heatpipe assembly from the interior of said vacuum enclosure to the exterior of said vacuum enclosure;
    means for coupling said proximal end to a heat generating device within said vacuum enclosure;
    means for coupling said distal end to a cooling device external to said vacuum enclosure;
    said vacuum feedthrough means including an opening in said vacuum enclosure, and vacuum flange means joined to said heatpipe assembly and secured to said opening in sealed fashion;
    said means for coupling said proximal end to a heat generating device including an adapter assembly having one portion joined to said heatpipe assembly and another portion coupled to said heat generating device;
    said adapter assembly including a pair of plates, and means for clamping said plates to said proximal end of said heatpipe assembly.

9. The apparatus for removing heat from a vacuum enclosure of claim 8, wherein said adapter assembly further includes an adapter plate extending from said pair of plates, and means for mounting said heat generating device on said adapter plate.

* * * * *